US008018726B2

(12) United States Patent
Friedlander et al.

(10) Patent No.: US 8,018,726 B2
(45) Date of Patent: Sep. 13, 2011

(54) MODULAR REMOTE CONTROL

(75) Inventors: Steven Friedlander, San Diego, CA (US); David Young, San Diego, CA (US)

(73) Assignees: Sony Corporation, Tokyo (JP); Sony Electronics Inc., Park Ridge, NJ (US)

(*) Notice: Subject to any disclaimer, the term of this patent is extended or adjusted under 35 U.S.C. 154(b) by 459 days.

(21) Appl. No.: 12/319,500

(22) Filed: Jan. 8, 2009

(65) Prior Publication Data

US 2010/0172109 A1 Jul. 8, 2010

(51) Int. Cl.
*H05K 5/00* (2006.01)
*G09G 5/00* (2006.01)

(52) U.S. Cl. .................................... 361/732; 345/156

(58) Field of Classification Search .................. 361/732, 361/731, 729

See application file for complete search history.

(56) References Cited

U.S. PATENT DOCUMENTS

| | | | | |
|---|---|---|---|---|
| 6,703,962 | B1 * | 3/2004 | Marics et al. | 341/176 |
| 6,738,047 | B2 * | 5/2004 | Kobayashi | 345/172 |
| 6,795,318 | B2 * | 9/2004 | Haas et al. | 361/729 |
| 2003/0052860 | A1 * | 3/2003 | Park et al. | 345/156 |
| 2004/0125080 | A1 * | 7/2004 | Ha et al. | 345/156 |
| 2005/0212979 | A1 | 9/2005 | Morita et al. | |
| 2007/0066394 | A1 | 3/2007 | Ikeda et al. | |

* cited by examiner

*Primary Examiner* — Lisa Lea Edmonds

(74) *Attorney, Agent, or Firm* — Miller Patent Services; Jerry A. Miller

(57) ABSTRACT

A modular remote control consistent with certain implementations has a first end module having a sliding connector disposed on one end thereof for sliding engagement with a mating sliding connector, wherein one of the sliding connector and the mating sliding connector is designated male and the other is designated female, respectively. A last end module has a mating sliding connector disposed on one end thereof for sliding engagement with a sliding connector. At least one intermediate module has both a sliding connector and a mating sliding connector, wherein, the modular remote control is assembled with the first end module mated by the sliding connection with the at least one intermediate module, and the last end module is mated to the at least one intermediate module by the sliding connection to produce a linear configuration of modules. A powered bus interconnects the first end module with the last end module and the at least one intermediate module via electrical connectors disposed on the sliding connector and the mating sliding connector. This abstract is not to be considered limiting, since other embodiments may deviate from the features described in this abstract.

24 Claims, 6 Drawing Sheets

MODULAR REMOTE CONTROL

COPYRIGHT AND TRADEMARK NOTICE

A portion of the disclosure of this patent document contains material which is subject to copyright protection. The copyright owner has no objection to the facsimile reproduction of the patent document or the patent disclosure, as it appears in the Patent and Trademark Office patent file or records, but otherwise reserves all copyright rights whatsoever. Trademarks are the property of their respective owners.

BACKGROUND

Home entertainment devices commonly use remote controller devices to facilitate convenience in user control. Such devices are common with television sets as well as home theater components, set top boxes, video player devices, audio devices and game consoles. Remote controller devices have many configurations and designs having varying layouts. Users of such devices often have several or many such controllers with various functions or may utilize multifunctional controllers. Of those controllers, users may develop familiarity with or preferences for certain layouts. But, a user generally has little ability to control preferences for the layout of their remote controllers.

BRIEF DESCRIPTION OF THE DRAWINGS

Certain illustrative embodiments illustrating organization and method of operation, together with objects and advantages may be best understood by reference detailed description that follows taken in conjunction with the accompanying drawings in which.

DETAILED DESCRIPTION

Figure 1:
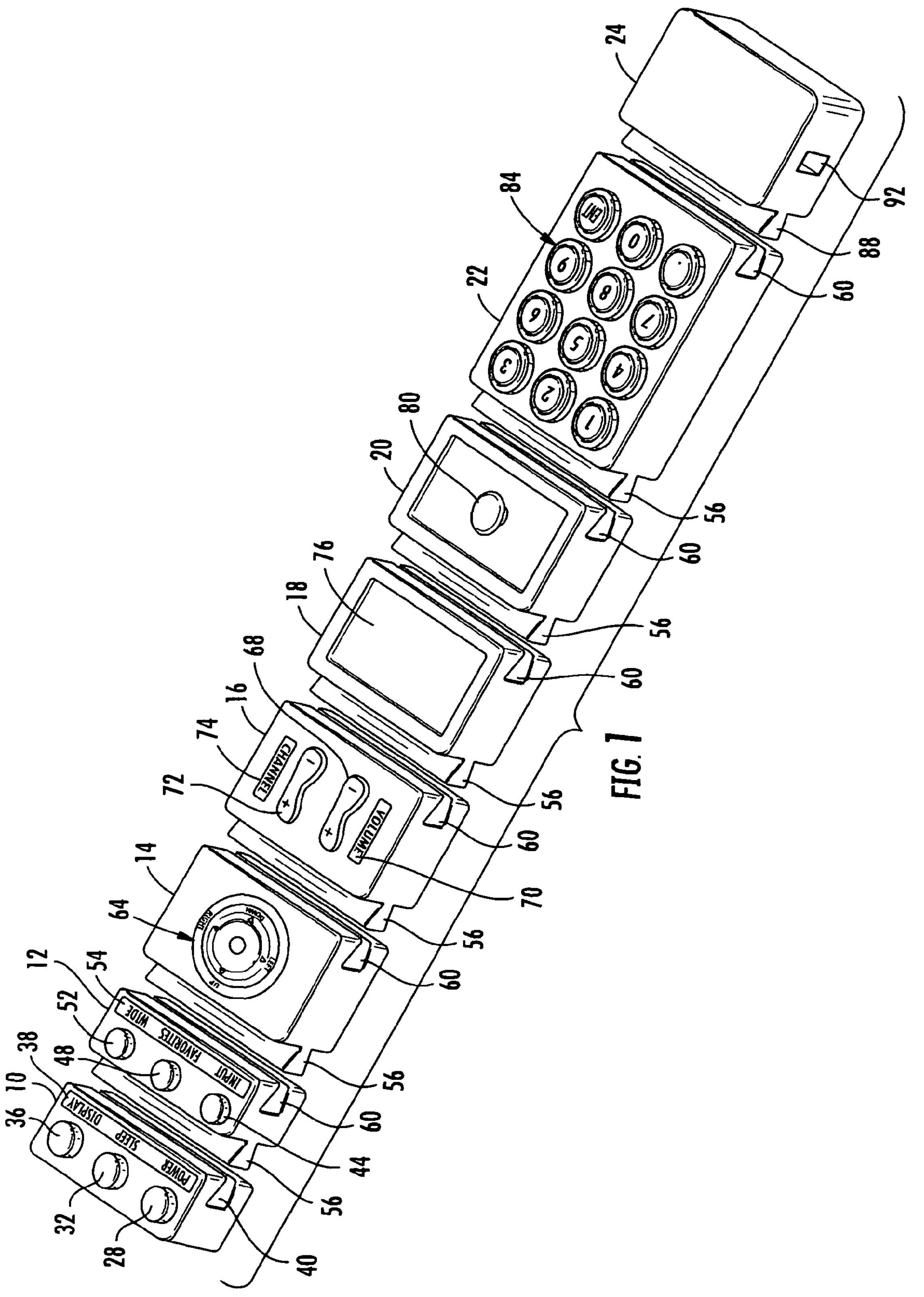
FIG. 1 is an exploded view of an example implementation of a modular remote controller consistent with certain embodiments of the present invention.

While this invention is susceptible of embodiment in many different forms, there is shown in the drawings and will herein be described in detail specific embodiments, with the understanding that the present disclosure of such embodiments is to be considered as an example of the principles and not intended to limit the invention to the specific embodiments shown and described. In the description below, like reference numerals are used to describe the same, similar or corresponding parts in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

Reference throughout this document to "one embodiment", "certain embodiments", "an embodiment", "an example", "an implementation" or similar terms means that a particular feature, structure, or characteristic described in connection with the embodiment, example or implementation is included in at least one embodiment, example or implementation of the present invention. Thus, the appearances of such phrases or in various places throughout this specification are not necessarily all referring to the same embodiment, example or implementation. Furthermore, the particular features, structures, or characteristics may be combined in any suitable manner in one or more embodiments, examples or implementations without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

The term "sliding" as used herein is used in the manner conventional with its use in connection with a "sliding dovetail" in woodworking parlance. That is, the male dovetail engages with a sliding action with a corresponding female dovetail slot.

In accord with certain implementation examples, a remote control device is provided with multiple sections (e.g., power, specialized or assignable keys, 5-way controller, joystick, touchpad, display, volume/channel, 10 key, etc.) to be independent and user configurable in any arrangement desired. The sections can be changed in order as well as certain of the buttons can be assigned to whatever function the user would like. Buttons can be provided with digital displays to dynamically label their function. Additionally new sections can be added to provide new functionality as the user wants or could come with or be provided for new components purchased. For example, a touchpad, joystick, 5-axis control, etc. could be provided for applicable controlled devices.

Since each user may prefer a different configuration of their remote control, the remote control can be configured to suit the individual. It would also permit reduction in the number of buttons thereby simplifying operation since the user would only have the buttons they want and can remove a modular component they don't want.

The sections of the remote control is in the form of modular sections that slide together and can be positioned in any configuration the user wants. The remote control can grow long or be very short depending on what the user wants and what devices are to be controlled.

The drawings that follow show the joints to be a sliding dovetail joint which is a very strong and secure joint, but that can be modified to other connections consistent with certain implementations so long as a solid mechanical connection is provided which is easy to configure.

Referring now to FIG. 1, an example implementation of a remote control consistent with certain embodiments is depicted as having eight separate modules 10, 12, 14, 16, 18, 20, 22 and 24. In the example implementation depicted in this figure, module 10, the leftmost module 10 as depicted provides for infrared or other communication with a compatible control receiver device. Module 10, in this example, further includes a power button 28, and related buttons such as a sleep timer button 32 and a display button 36. Other configurations of this module are, of course, possible. However, with infrared (IR) based remote controls, an infrared transmitter module preferably forms an end module so as to direct IR energy toward the device being controlled in a conventional manner. The function of buttons 28, 32 and 36 can be displayed on a display 38, whether the functions are fixed or user configurable.

Module 10 further incorporates a single sliding dovetail connector (either male or female configurations are contemplated by simply exchanging male with female and vice versa in each instance) 40, which in this example case is a female connector. While not depicted explicitly, the dovetail connector incorporates a plurality of connectors that form a common bus used along the length of the remote control to permit semi-random interconnection of the various modules as desired to make up the remote control. Module 10 is shown adjacent module 12 in this illustration which incorporates three user configurable or fixed functions such as an input selection button 44, a favorites button 48 and a wide screen toggle 52 (by way of example without intent of imposing any limitation of the configuration or function of the buttons that can be provided). The function of those buttons may be displayed on a display 54. Module 12, as with most modules, includes both a male sliding dovetail connector 56 and a female sliding dovetail connector 60. It will be noted that most modules (in this example, modules 12-22, incorporate both male 56 and female 60 connectors so that the modules can be arranged in any order preferred by the particular user. Modules 10 and 24 are the exception in this case in that they provide for end terminations for the assembly. In this example, module 10 provides a logical function of IR transmitter and power functions at one end, while module 24 provides for a battery function at the other. A remote control processor which may be a programmed processor or a fixed function circuit is provided, preferably in one of these modules since these modules form a termination module that is required for function of the remote control. Hence, a remote control processor can be provided, for example, in module 10 or 24 to carry out the commands issued by the user.

Module 14 provides for a four direction navigation function (up, down, left and right) and a central select function, all depicted as 64 and incorporates both male and female connectors as discussed previously. Module 16 includes volume up and down control 68 and a display or label 70 to indicate this function and channel up and down controls 72 and a similar display or label 74 to display this function. Module 18 includes a touchpad 76 for navigation by touchpad, while module 20 has a joystick type controller 80. Module 84 carries a ten-key number pad 84 used for direct numerical entry. Module 24 has only a male sliding dovetail connector 88 in this implementation and also has a universal serial bus (USB) connector 92 in this implementation that can be used to interconnect the remote control to a computer for programming of user programmable keys and for charging a rechargeable battery if so equipped. Preferably the USB connector 92 (if provided on this module) is configured to draw no power unless in use.

It is noted that the controls depicted are not the only ones that can be provided by modules consistent with implementations of the present invention. For example, a module can be provided for record and playback features so that the remote control can be adapted to use with a personal video recorder (PVR—also known as a digital video recorder or DVR), video cassette recorder, video disc recorder or the like as well as stereo and home theatre functions.

Figure 2:
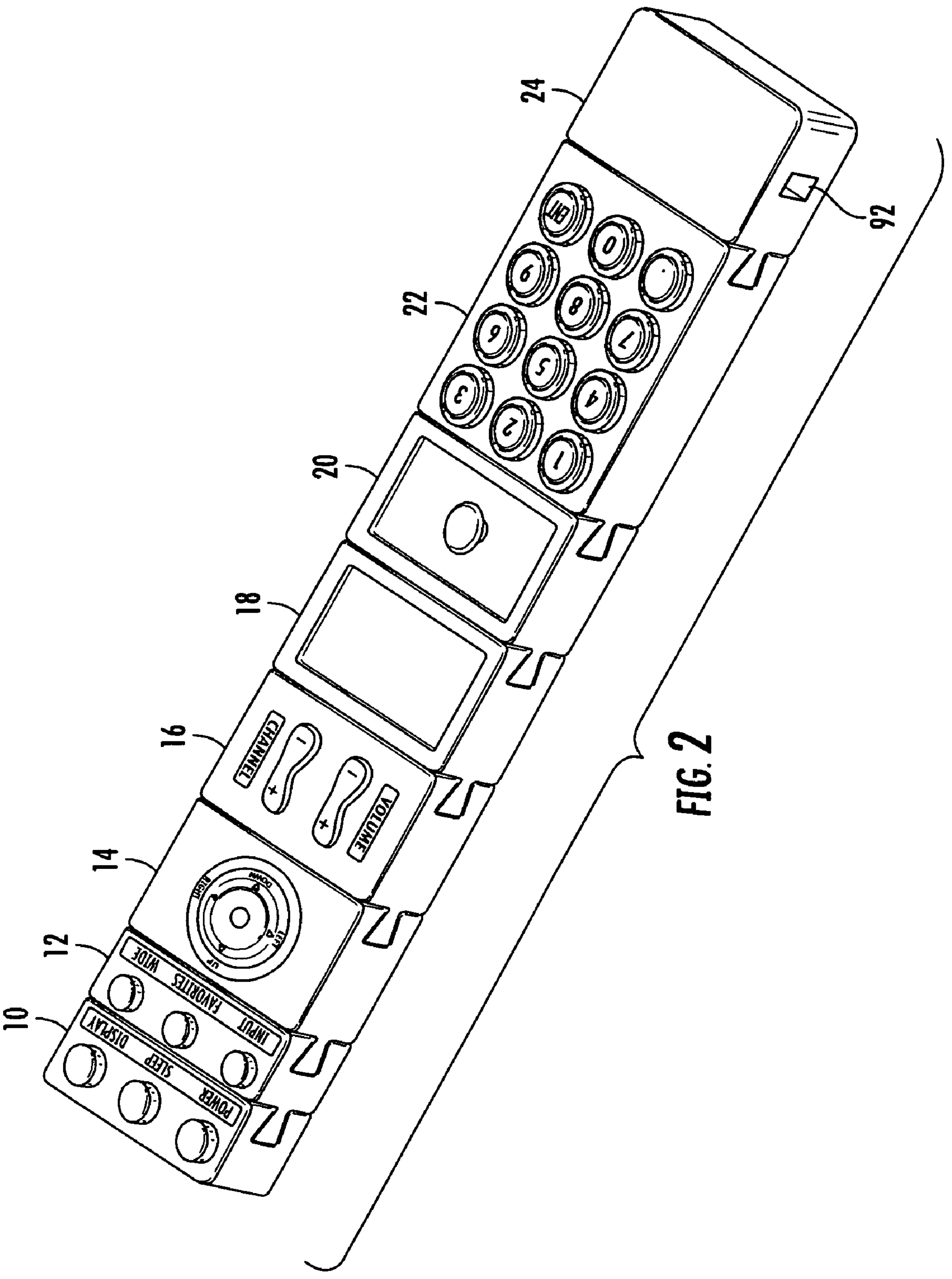
FIG. 2 is an assembled view of the example implementation of a modular remote controller of FIG. 1 consistent with certain embodiments of the present invention.

FIG. 1 depicts the modules disassembled, but arranged in one order of assembly. FIG. 2 depicts the modules 10-24 assembled in this order by engaging the male sliding dovetails into the sliding engagement with the female sliding dovetails. In each case, the sliding engagement is in a direction perpendicular to the length of the assembled remote control (i.e., perpendicular to a line drawn between module 10 and module 24 when the remote control assembled). It will be appreciated that in on variation, the sliding dovetails can include a stop or latch that halts the engagement at a point of alignment of the modules and holds the modules in place at this point until disengagement is desired. This can be accomplished in any number of ways. Additionally, when the male and female modules are fully engaged, electrical connections are completed to provide power and signaling along the length of the remote control.

Figure 3:
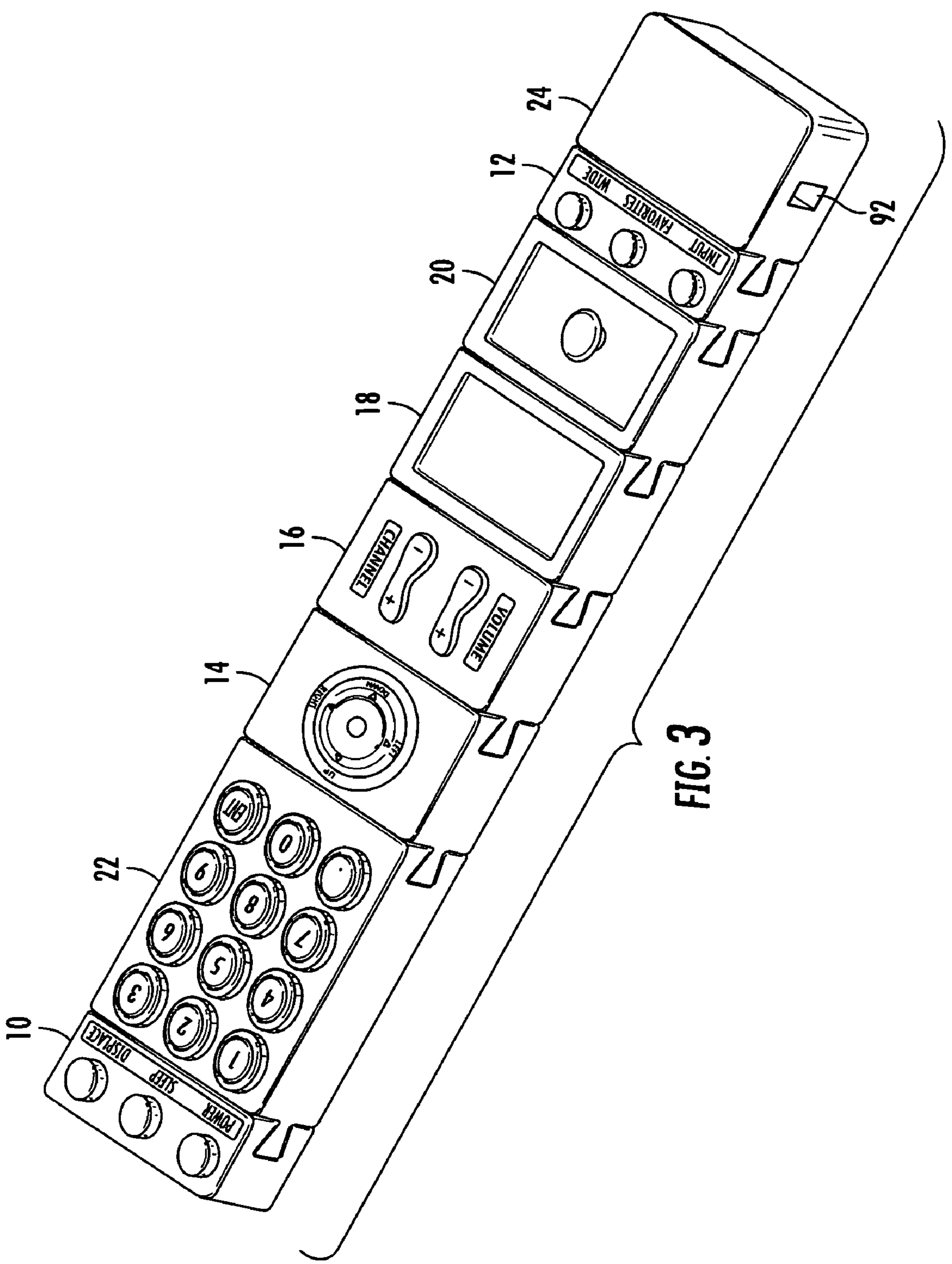
FIG. 3 is an assembled view of the example implementation of a modular remote controller of FIG. 1 with several modules rearranged in a manner consistent with certain embodiments of the present invention.

FIG. 3 depicts another arrangement by way of example in which module 22 is shifted to near the top of the remote control to engage modules 10 and 14 while module 12 is shifted to the bottom to engage modules 20 and 24. Hence, users having differing preferences for the remote control configuration can enjoy use of the same set of modules configured in any desired arrangement of the central modules, with the end modules remaining defined.

Figure 4:
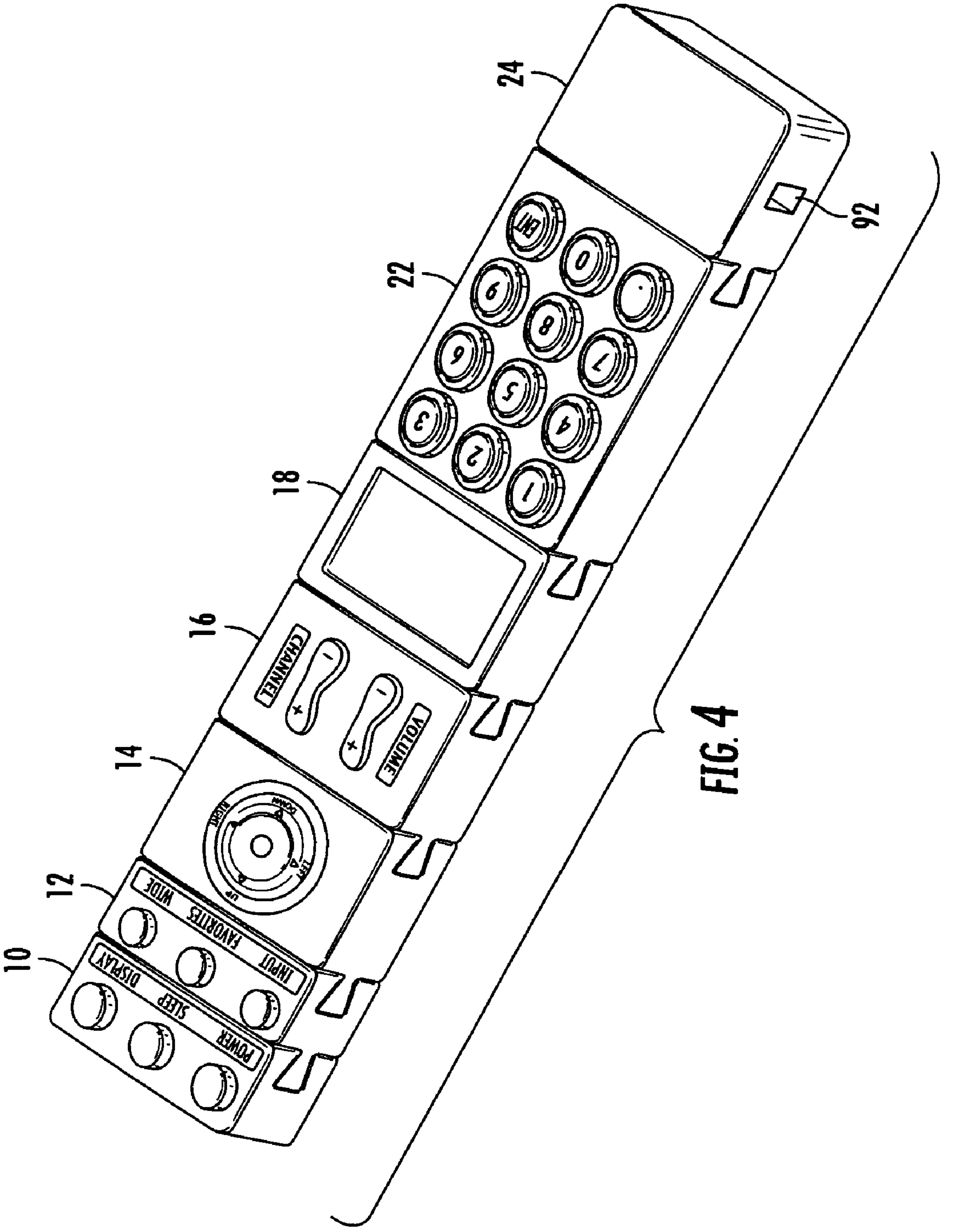
FIG. 4 is an assembled view of the example implementation of a modular remote controller of FIG. 1 with the joystick module omitted in a manner consistent with certain embodiments of the present invention.

FIG. 4 depicts another arrangement by way of example in which module 20 is not desired or needed by a particular user. In this case, module 20 is omitted entirely. It will be evident upon consideration of this discussion that one could configure any number of modules in accord with the needs of the user and the devices being controlled. In another arrangement not depicted, one could envision a simplified remote control suitable for children or those who desire or need a simple remote control for a television set having only modules 10, 16 and 24. Other simplified TV set arrangements could include only modules 10, 22 and 24, or only 10, 16, 22 and 24. Other arrangements including modules with functionality not explicitly described are also contemplated.

Figure 5:
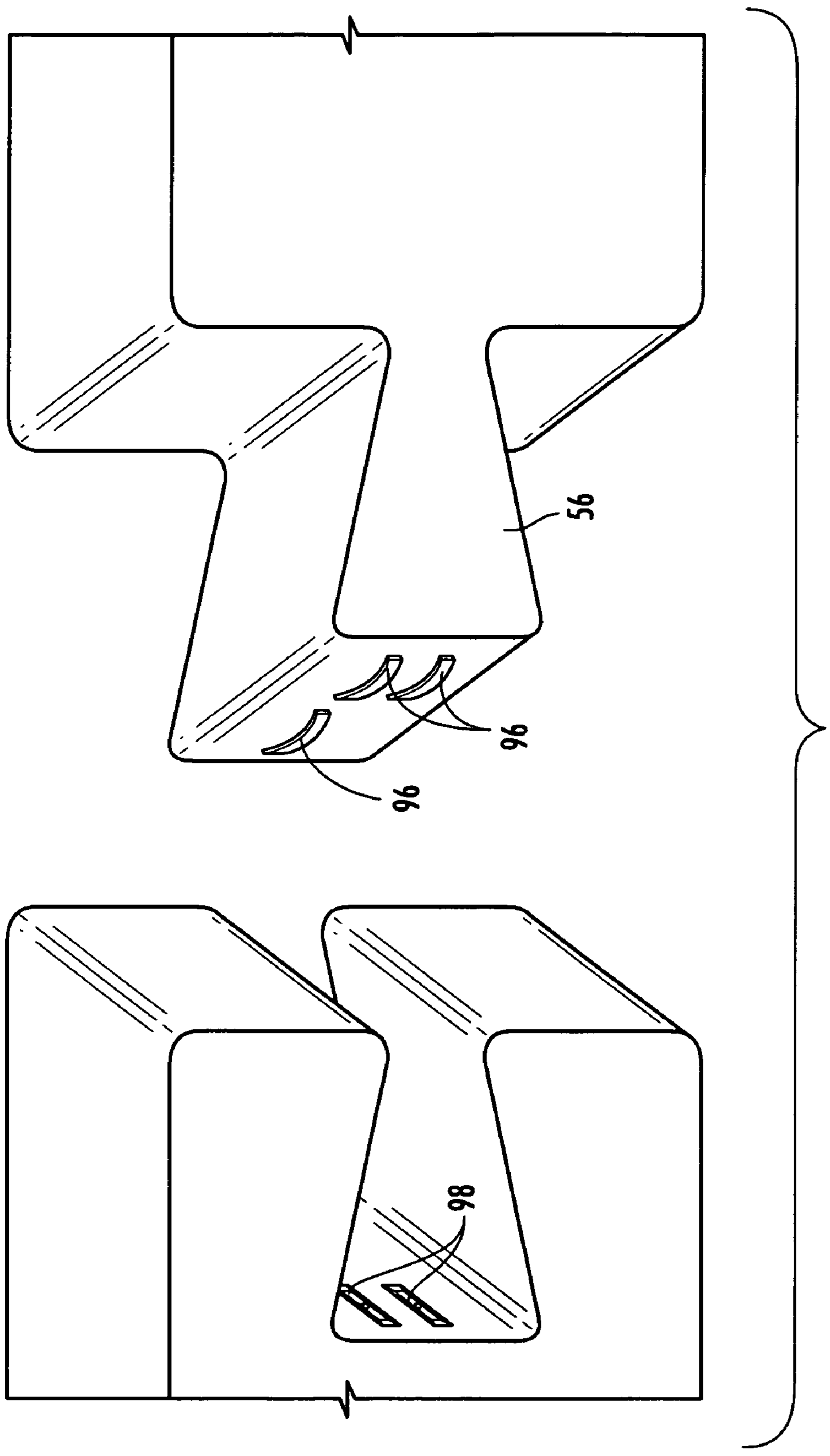
FIG. 5 is a view of one implementation of the male sliding dovetail 56 wherein a plurality of spring contacts are provided that engage mating recessed contacts on the female sliding dovetail member in a manner consistent with certain implementations.

FIG. 5 is a view of one implementation of the male sliding dovetail 56 (or 88) wherein a plurality of spring contacts 96 are provided that engage mating recessed contacts 98 on the female sliding dovetail member 60 (or 40) in a manner consistent with certain implementations. This permits power and signals to be passed along a powered bus that extends along a length of the remote control. In certain embodiments, the contacts can be staggered in such a manner that sliding the modules in place only engages the contacts in one configuration. For example, the contacts can be staggered as shown, or can be arranged in a diagonal across the face of the dovetail so that engagement and electrical contact only occurs upon full engagement of the male dovetail with the female dovetail. The spring contacts engage recessed contacts in the opposing face of the female dovetail thereby both making electrical connection and holding the dovetail joints in full engagement. In other arrangements, a latching arrangement (manual or automatic) can be used to cause both mechanical and electrical engagement of the dovetail joints. Other arrangements will occur using other sliding joinery upon consideration of the present teachings.

Figure 6:
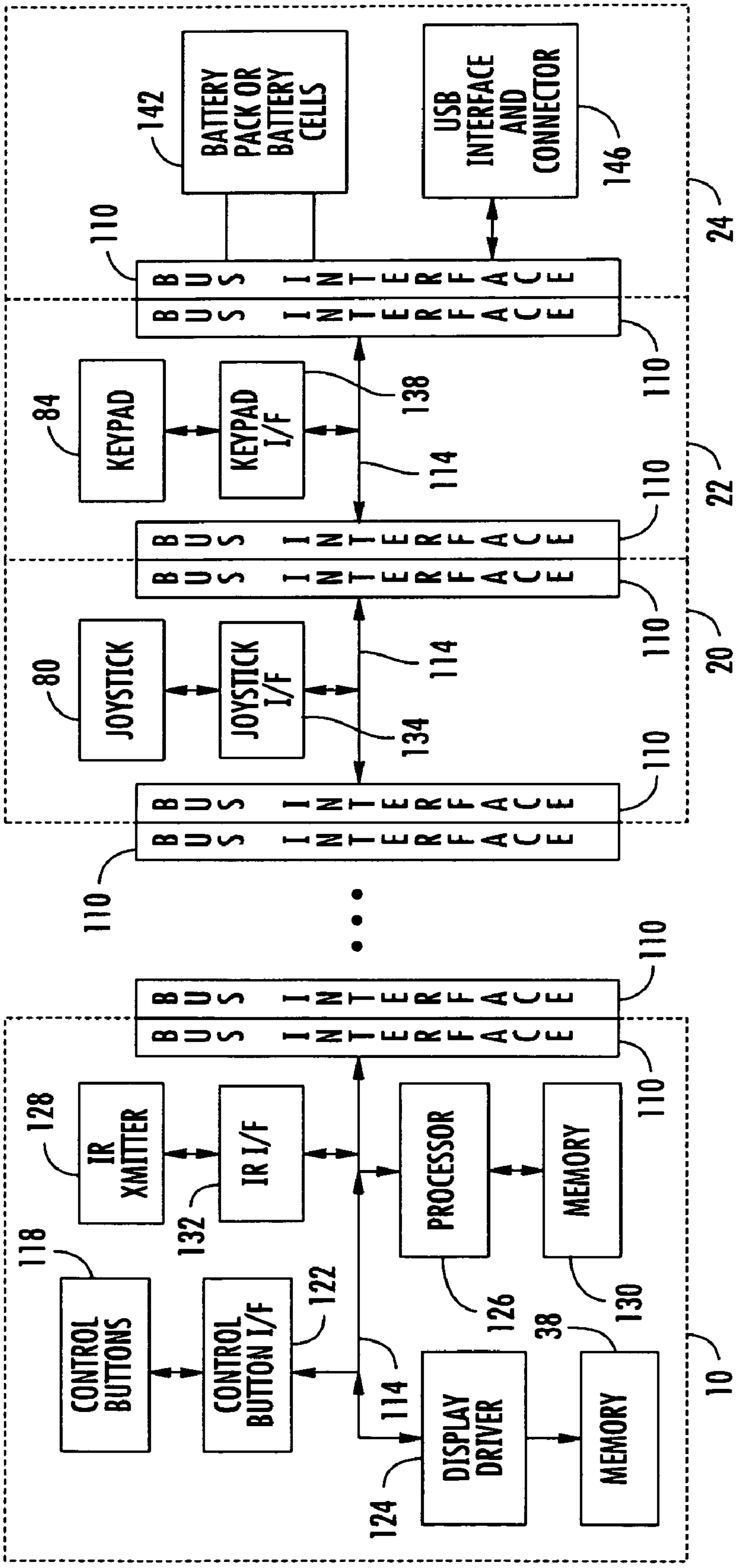
FIG. 6 is an example block diagram of one implementation of the circuitry of a modular remote controller consistent with certain embodiments of the present invention.

FIG. 6 depicts one example arrangement of an illustrative portion of the electronics within the remote control devices previously depicted. It is noted that the communication speed needed between modules is not generally very high, so a relatively simple bus structure can be utilized so as to minimize the number of interconnections if desired. In this illustration, module 10 is depicted having a single bus interface 110 with connectors residing within the female sliding dovetail 40. Bus and power connections inside the modules are shown throughout by connections 114 and bus interfaces for all modules are designated 110 for convenience.

Module 10 includes a set of buttons 28, 32 and 36 collectively designated 118 in this figure with any support and interface (I/F) circuitry designated 122. As with module 12 and any other desired module, the button's function can be displayed via a display 38 driven by a display driver 124 under control of the processor 126. The interface circuitry 122 is coupled to appropriate connections 114 or directly to a programmable or hardware processor 126 which interprets actuation of the buttons and carries out appropriate commands associated therewith. Processor 126 may include volatile and/or non-volatile memory designated 130. Power is supplied to the processor and other circuitry of module 10 through the powered bus via bus interface 110. The module 10 also includes an IR transmitter 128 driven by IR interface 132 to provide IR commands to the controlled device.

For simplicity of illustration, modules 12-18 are not depicted in this figure. Module 20 incorporates a joystick 80 with an appropriate interface 134 that is coupled via 114 to bus interfaces 110 so as to receive power from the powered bus. Similarly, module 22 incorporates a keypad 84 with an appropriate interface 138 that is coupled via 114 to bus interfaces 110 so as to receive power from the powered bus.

Unlike the other modules, module 24 has a single male interface in this implementation (although reversal of male and female is contemplated). In this implementation, a rechargeable battery pack or a set of battery cells 142 are provided in order to power the remote control. A voltage regulator (not shown) may also be provided in this or any other module as required or desirable. Regulated or unregulated power is thus provided to bus interface 110 and passed down the chain of modules thereby. If a USB connector is provided, a USB interface 146 is interfaced and interconnected with the bus interface 110.

Hence, the various modules of the remote control may be interconnected in any order between the first module and the last module as a user desires or needs in order to control the various controllable devices at his or her disposal. While this example shows the processor in module 10, it could equally well be disposed in module 24 along with the battery without deviating from embodiments consistent with the present invention.

Thus, a modular remote control consistent with certain implementations has a first end module having a sliding connector disposed on one end thereof for sliding engagement with a mating sliding connector, wherein one of the sliding connector and the mating sliding connector is designated male and the other is designated female, respectively. A last end module has a mating sliding connector disposed on one end thereof for sliding engagement with a sliding connector. At least one intermediate module has both a sliding connector and a mating sliding connector, wherein, the modular remote control is assembled with the first end module mated by the sliding connection with the at least one intermediate module, and the last end module is mated to the at least one intermediate module by the sliding connection to produce a linear configuration of modules. A powered bus interconnects the first end module with the last end module and the at least one intermediate module via electrical connectors disposed on the sliding connector and the mating sliding connector.

In certain implementations, the sliding connector comprises one of a male and female sliding dovetail connector, and wherein the mating sliding connector comprises one of a female and a male sliding dovetail connector respectively. In certain implementations, one of the first end modules and the last end modules carries a battery. In certain implementations, one of the first end modules and the last end modules carries an infrared (IR) transmitter. In certain implementations, one of the first end modules and the last end modules carries a universal serial port. In certain implementations, the at least one intermediate module carries at least one of a power control, a set of user configurable buttons, a volume control, a channel control, a four way navigation control, a touch pad, a joystick, a display, a ten key pad, record feature controls, playback feature controls, home theatre controls and a universal serial port. In certain implementations, one of the first end and last end modules carries a remote control processor.

Another modular remote control, consistent with certain implementation has a first end module having a sliding dovetail connector disposed on one end thereof for sliding engagement with a mating sliding dovetail connector, wherein one of the sliding dovetail connector and the mating sliding dovetail connector is designated male and the other is designated female, respectively. A battery is disposed in the first end module. A last end module has a mating sliding dovetail connector disposed on one end thereof for sliding engagement with a sliding dovetail connector. An infrared transmitter is disposed in the last end module. At least one intermediate module has both a sliding dovetail connector and a mating sliding dovetail connector disposed on opposing ends thereof. The modular remote control is assembled with the first end module mated by the sliding dovetail connection with the at least one intermediate module, and the last end module is mated to the at least one intermediate module by the sliding dovetail connection to produce a linear configuration of modules. A remote control processor is disposed in one of modules. A powered bus interconnects the first end module with the last end module and the at least one intermediate module via electrical connectors disposed on the sliding dovetail connector and the mating sliding dovetail connector.

In certain implementations, one of the first end modules and the last end modules carries a universal serial port. In certain implementations, the at least one intermediate module carries at least one of a power control, a set of user configurable buttons, a volume control, a channel control, a four way navigation control, a touch pad, a joystick, a display, a ten key pad, record feature controls, playback feature controls, home theatre controls, and a universal serial port. In certain implementations, at least one of the modules carries a volume and channel control. In certain implementations, at least one of the modules carries a ten key pad. In certain implementations, at least one of the modules carries a navigation control.

Another modular remote control consistent with certain implementations has a first end module having a sliding dovetail connector disposed on one end thereof for sliding engagement with a mating sliding dovetail connector, wherein one of the sliding dovetail connector and the mating sliding dovetail connector is designated male and the other is designated female, respectively. A battery is disposed in the first end module. A last end module has a mating sliding dovetail connector disposed on one end thereof for sliding engagement with a sliding dovetail connector. An infrared transmitter is disposed in the last end module. An intermediate navigation module has both a sliding dovetail connector and a mating sliding dovetail connector disposed on opposing ends thereof and containing a navigation control. An intermediate volume/channel module has a volume control and a channel control and also has both a sliding dovetail connector and a mating sliding dovetail connector disposed on opposing ends thereof. An intermediate ten key module has a ten key pad and a channel control and also has both a sliding dovetail connector and a mating sliding dovetail connector disposed on opposing ends thereof. The modular remote control is assembled with the first end module mated by the sliding dovetail connection with any arrangement of the intermediate modules, and the last end module is mated to the other end of the arrangement of intermediate modules by the sliding dovetail connection to produce a linear configuration of modules. A remote control processor is disposed in one of the modules. A powered bus interconnects the first end module with the last end module and the intermediate modules via electrical connectors disposed on the sliding dovetail connector and the mating sliding dovetail connector. In certain implementations, one of the first end modules and the last end modules carries a universal serial port.

In another embodiment, a modular remote control module has a function intermediate module having both a sliding connector and a mating sliding connector, one disposed on opposing ends thereof and carrying circuitry that carries out a remote control function, wherein one of the sliding connector and the mating sliding connector is designated male and the other is designated female, respectively. Electrical connectors are disposed on the sliding connector and the mating sliding connector to carry power and data via a powered bus across the module to the opposing ends thereof, and the data and power are coupled to the circuitry that carries out the remote control function.

In certain implementations, the modular remote control is assembled with first end module mated by the sliding connection with the at least one intermediate module, and a last end module is mated to the at least one intermediate module by the sliding connection to produce a linear configuration of modules. In certain implementations, one of the first end modules and the last end modules carries a battery and wherein one of the first end modules and the last end modules carries an infrared (IR) transmitter. In certain implementations, the sliding connector comprises one of a male and female sliding dovetail connector, and wherein the mating sliding connector comprises one of a female and a male sliding dovetail connector respectively. In certain implementations, the circuitry that carries out a remote control function comprises at least one of a power control, a set of user configurable buttons, a volume control, a channel control, a four way navigation control, a touch pad, a joystick, a display, a ten key pad, record feature controls, playback feature controls, home theatre controls and a universal serial port.

In another embodiment, a modular configurable remote control has a plurality of freestanding interconnected modules that collectively make up a functional remote control. Each of the freestanding modules has at least one of a dovetail connector element along an edge thereof, and a dovetail slot along an edge thereof, where a dovetail connector element mates with a dovetail slot to interconnect the freestanding modules. Both the dovetail connector element and the dovetail slot have a plurality of electrical connectors residing of a surface thereof so as to electrically interconnect the plurality of modules.

In certain implementations, the electrical interconnection of the plurality of modules is via a powered bus carried over the electrical connectors. In certain implementations, the plurality of modules has at least a top end module and a bottom end module, one of which has only the dovetail connector element and the other of which has only the dovetail slot. In certain implementations, the plurality of modules additionally includes one or more intermediate modules situated between the top end module and the bottom end module, wherein each intermediate module has both the dovetail connector element and the dovetail slot. In certain implementations, the plurality of modules comprise two or more intermediate modules that can be situated between the top end module and the bottom end module in any order without affecting the functionality of any of the modules.

Those skilled in the art will recognize, upon consideration of the above teachings, that certain of the above exemplary embodiments are based upon use of a programmed remote control processor. However, the invention is not limited to such exemplary embodiments, since other embodiments could be implemented using hardware component equivalents such as special purpose.

While certain illustrative embodiments have been described, it is evident that many alternatives, modifications, permutations and variations will become apparent to those skilled in the art in light of the foregoing description.

What is claimed is:

1. A modular remote control, comprising:

a first end module having a sliding connector disposed on one end thereof for sliding engagement with a mating sliding connector;

wherein one of the sliding connector and the mating sliding connector is designated male and the other is designated female, respectively;

a last end module having a mating sliding connector disposed on one end thereof for sliding engagement with a sliding connector;

at least one intermediate module having both a sliding connector and a mating sliding connector;

wherein, the modular remote control is assembled with the first end module mated by the sliding connection with the at least one intermediate module, and the last end module is mated to the at least one intermediate module by the sliding connection to produce a linear configuration of modules; and a powered bus interconnecting the first end module with the last end module and the at least one intermediate module via electrical connectors disposed on the sliding connector and the mating sliding connector.

2. The modular remote control according to claim 1, wherein the sliding connector comprises one of a male and female sliding dovetail connector, and wherein the mating sliding connector comprises one of a female and a male sliding dovetail connector respectively.

3. The modular remote control according to claim 1, wherein one of the first end modules and the last end modules carries a battery.

4. The modular remote control according to claim 1, wherein one of the first end modules and the last end modules carries an infrared (IR) transmitter.

5. The modular remote control according to claim 1, wherein one of the first end modules and the last end modules carries a universal serial port.

6. The modular remote control according to claim 1, wherein the at least one intermediate module carries at least one of a power control, a set of user configurable buttons, a volume control, a channel control, a four way navigation control, a touch pad, a joystick, a display, a ten key pad, record feature controls, playback feature controls, home theatre controls and a universal serial port.

7. The modular remote control according to claim 1, wherein one of the first end and last end modules carries a remote control processor.

8. A modular remote control, comprising:

a first end module having a sliding dovetail connector disposed on one end thereof for sliding engagement with a mating sliding dovetail connector;

wherein one of the sliding dovetail connector and the mating sliding dovetail connector is designated male and the other is designated female, respectively;

a battery disposed in said first end module;

a last end module having a mating sliding dovetail connector disposed on one end thereof for sliding engagement with a sliding dovetail connector;

an infrared transmitter disposed in the last end module;

at least one intermediate module having both a sliding dovetail connector and a mating sliding dovetail connector disposed on opposing ends thereof;

wherein, the modular remote control is assembled with the first end module mated by the sliding dovetail connection with the at least one intermediate module, and the last end module is mated to the at least one intermediate module by the sliding dovetail connection to produce a linear configuration of modules;

a remote control processor disposed in one of said modules; and a powered bus interconnecting the first end module with the last end module and the at least one intermediate module via electrical connectors disposed on the sliding dovetail connector and the mating sliding dovetail connector.

9. The modular remote control according to claim 8, wherein one of the first end modules and the last end modules carries a universal serial port.

10. The modular remote control according to claim 8, wherein the at least one intermediate module carries at least one of a power control, a set of user configurable buttons, a volume control, a channel control, a four way navigation control, a touch pad, a joystick, a display, a ten key pad, record feature controls, playback feature controls, home theatre controls, and a universal serial port.

11. The modular remote control according to claim 8, wherein at least one of the modules carries a volume and channel control.

12. The modular remote control according to claim 8, wherein at least one of the modules carries a ten key pad.

13. The modular remote control according to claim 8, wherein at least one of the modules carries a navigation control.

14. A modular remote control, comprising:

a first end module having a sliding dovetail connector disposed on one end thereof for sliding engagement with a mating sliding dovetail connector;

wherein one of the sliding dovetail connector and the mating sliding dovetail connector is designated male and the other is designated female, respectively;

a battery disposed in said first end module;

a last end module having a mating sliding dovetail connector disposed on one end thereof for sliding engagement with a sliding dovetail connector;

an infrared transmitter disposed in the last end module;

an intermediate navigation module having both a sliding dovetail connector and a mating sliding dovetail connector disposed on opposing ends thereof and containing a navigation control;

an intermediate volume/channel module having a volume control and a channel control and having both a sliding dovetail connector and a mating sliding dovetail connector disposed on opposing ends thereof;

an intermediate ten key module having a ten key pad and a channel control and having both a sliding dovetail connector and a mating sliding dovetail connector disposed on opposing ends thereof;

wherein, the modular remote control is assembled with the first end module mated by the sliding dovetail connection with the intermediate modules, and the last end module is mated to the intermediate modules by the sliding dovetail connection to produce a linear configuration of modules;

a remote control processor disposed in one of said modules; and a powered bus interconnecting the first end module with the last end module and the intermediate modules via electrical connectors disposed on the sliding dovetail connector and the mating sliding dovetail connector.

15. The modular remote control according to claim 14, wherein one of the first end modules and the last end modules carries a universal serial port.

16. A modular remote control module, comprising: a function intermediate module having both a sliding connector and a mating sliding connector, one disposed on opposing ends thereof and carrying circuitry that carries out a remote control function; wherein one of the sliding connector and the mating sliding connector is designated male and the other is designated female, respectively; electrical connectors disposed on the sliding connector and the mating sliding connector to carry power and data via a powered bus across the module to the opposing ends thereof and wherein the data and power are coupled to the circuitry that carries out the remote e0ntrol function, wherein the sliding connector comprises one of a male and female sliding dovetail connector, and wherein the mating sliding connector comprises one of a female and a male sliding dovetail connector respectively.

17. The modular remote control module according to claim 16, wherein, the modular remote control is assembled with first end module mated by the sliding connection with the at least one intermediate module, and a last end module is mated to the at least one intermediate module by the sliding connection to produce a linear configuration of modules.

18. The modular remote control module according to claim 17, wherein one of the first end modules and the last end modules carries a battery and wherein one of the first end modules and the last end modules carries an infrared (IR) transmitter.

19. The modular remote control module according to claim 16, wherein the circuitry that carries out a remote control function comprises at least one of a power control, a set of user configurable buttons, a volume control, a channel control, a four way navigation control, a touch pad, a joystick, a display, a ten key pad, record feature controls, playback feature controls, home theatre controls and a universal serial port.

20. A modular configurable remote control, comprising:

a plurality of freestanding interconnected modules that collectively comprises a functional remote control;

wherein, each of the freestanding modules has at least one of a dovetail connector element along an edge thereof, and a dovetail slot along an edge thereof, where a dovetail connector element mates with a dovetail slot to interconnect the freestanding modules; and wherein both the dovetail connector element and the dovetail slot have a plurality of electrical connectors residing of a surface thereof so as to electrically interconnect the plurality of modules.

21. The modular configurable remote control according to claim 20, wherein the electrical interconnection of the plurality of modules is via a powered bus carried over the electrical connectors.

22. The modular configurable remote control according to claim 20, wherein, when the plurality of modules comprise at least a top end module and a bottom end module, one of which has only the dovetail connector element and the other of which has only the dovetail slot.

23. The modular configurable remote control according to claim 22, wherein the plurality of modules additionally comprise one or more intermediate modules situated between the top end module and the bottom end module, wherein each intermediate module has both the dovetail connector element and the dovetail slot.

24. The modular configurable remote control according to claim 23, wherein the plurality of modules comprise two or more intermediate modules that can be situated between the top end module and the bottom end module in any order without affecting the functionality of any of the modules.

* * * * *